United States Patent [19]

Bullock et al.

[11] 4,380,721

[45] Apr. 19, 1983

[54] PROXIMITY SWITCH

[76] Inventors: John W. Bullock, 67 Margarita, Camarillo, Calif. 93010; Lawrence T. Miranda, 91-564 Pupu St., Ewa Beach, Hi. 96706

[21] Appl. No.: 221,085

[22] Filed: Dec. 29, 1980

[51] Int. Cl.³ .................... H05B 37/02; H01K 7/00
[52] U.S. Cl. .................................. 315/362; 315/76; 315/150
[58] Field of Search .................. 331/65; 315/362, 76, 315/150; 361/181; 340/552

[56] References Cited

U.S. PATENT DOCUMENTS

| 3,384,789 | 5/1968 | Teshima | 361/181 |
| 3,483,437 | 12/1969 | Coyne | 361/181 |
| 3,828,335 | 8/1974 | Salmet | 340/552 |
| 3,919,629 | 11/1975 | Scruggs | 331/65 |
| 4,095,214 | 6/1978 | Minasy | 340/552 |
| 4,125,794 | 11/1978 | Pohl | 315/362 |
| 4,215,341 | 7/1980 | Cole | 331/65 |

Primary Examiner—Harold A. Dixon
Attorney, Agent, or Firm—Roger A. Marrs

[57] ABSTRACT

A proximity switch or detector is disclosed herein having an oscillator circuit for establishing a radio frequency field about an antenna so that the presence of an object or agent in close proximity to the antenna causes the oscillator to become loaded and to cease oscillations. A voltage comparator senses a change of voltage from the oscillator and triggers a bistable circuit. A power-up or setting circuit primes the bistable circuit to be responsive to the trigger signal from the voltage comparator which, in turn, actuates an output driver circuit incorporating a light emitting diode network operably coupled to a load plug interconnecting with a suitable electrical appliance intended to be actuated by the presence of the object or agent.

1 Claim, 3 Drawing Figures

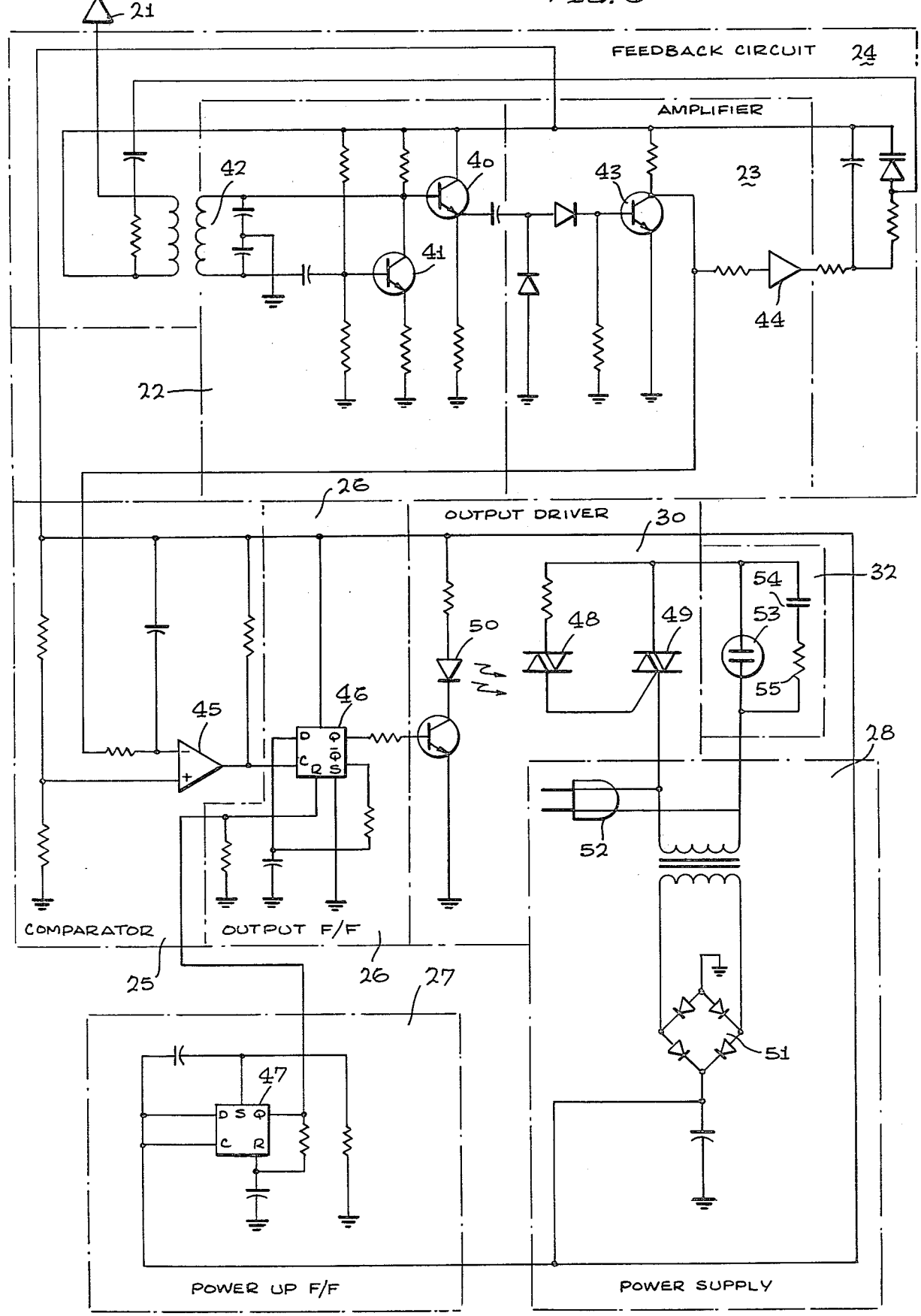

PROXIMITY SWITCH

BACKGROUND OF THE INVENTION

1. Field of the Invention

The present invention relates to proximity switches or detectors and more particularly to electronic controlled devices of this type sensitive to the presence of a person or object in its vicinity.

2. Brief Description of the Prior Art

In the past, a variety of proximity detectors and switches have been employed which respond to the presence of an object or agent. Problems and difficulties have been encountered with these prior devices such as disclosed in U.S. Pat. Nos. 3,384,789 and 2,810,066 which stem largely from the fact that mechanical relys are employed. Such relys are noisy and have a tendancy to foul easily. Also, these latter devices are electromechanical and are therefore heavy and require mechanical maintenance.

Therefore, a long standing need has existed to provide a novel proximity detector or switch which is composed entirely of electronic components and which is not sensitive to spurious line voltages or other interferences.

SUMMARY OF THE INVENTION

Accordingly, the above problems and difficulties are obviated by the present invention which provides a novel proximity detector or switch having an oscillator means for establishing an electromagnetic field about an antenna such that the presence of an object or agent in the field causes the oscillator to be loaded to the point where oscillations cease so as to provide a variable voltage output. Amplifier means are connected to the oscillator means for monitoring the condition of the oscillator means and for rectifing its output. A voltage comparator circuit is operably connected to the amplifier means for sensing the dip in voltage resulting from the interference with the electromagnetic field so as to produce a signal in response thereto. An output circuit including a bistable device is connected to the voltage comparator circuit in order to receive the signal generated thereby and to pass the signal in combination with a voltage level from a setting circuit for operably actuating an output driver circuit connected to a load.

Therefore, it is among the primary object of the present invention to provide a novel proximity detector or switch having improved switching means for controling energation of a variety of electrical appliances.

Another object of the present invention is to provide a novel proximity switch which includes bistable elements as a switch operable in response to voltage levels from a voltage comparator circuit as well as a setting circuit for operably powering a load comprising a variety of suitable electronic appliances for apparatus.

Still a further object of the present invention is to provide a novel proximity switch which is totally electronic in operation and in construction and which is void of mechanical relys, switches or the like.

Still a further object of the present invention is to provide a novel electronically controlled proximity switch or detector wherein the sensitive element is operable by the presence of a person or object within a predetermined distance therefrom and one which will differentiate between certain objects and others such as being sensitive to the proximity of a human being, but which is unaffected by an inanimate object such as a plant.

BRIEF DESCRIPTION OF THE DRAWINGS

The features of the present invention which are believed to be novel are set forth with particularity in the appended claims. The present invention, both as to its organization and manner of operation, together with further objects and advantages thereof, may best be understood by reference to the following description, taken in connection with the accompanying drawings in which:

FIG. 3 is a detailed schmetic drawing of the proximity switch incorporating the present invention showing the various components therefore.

DESCRIPTION OF THE PREFERRED EMBODIMENT

Figures 1, 2:
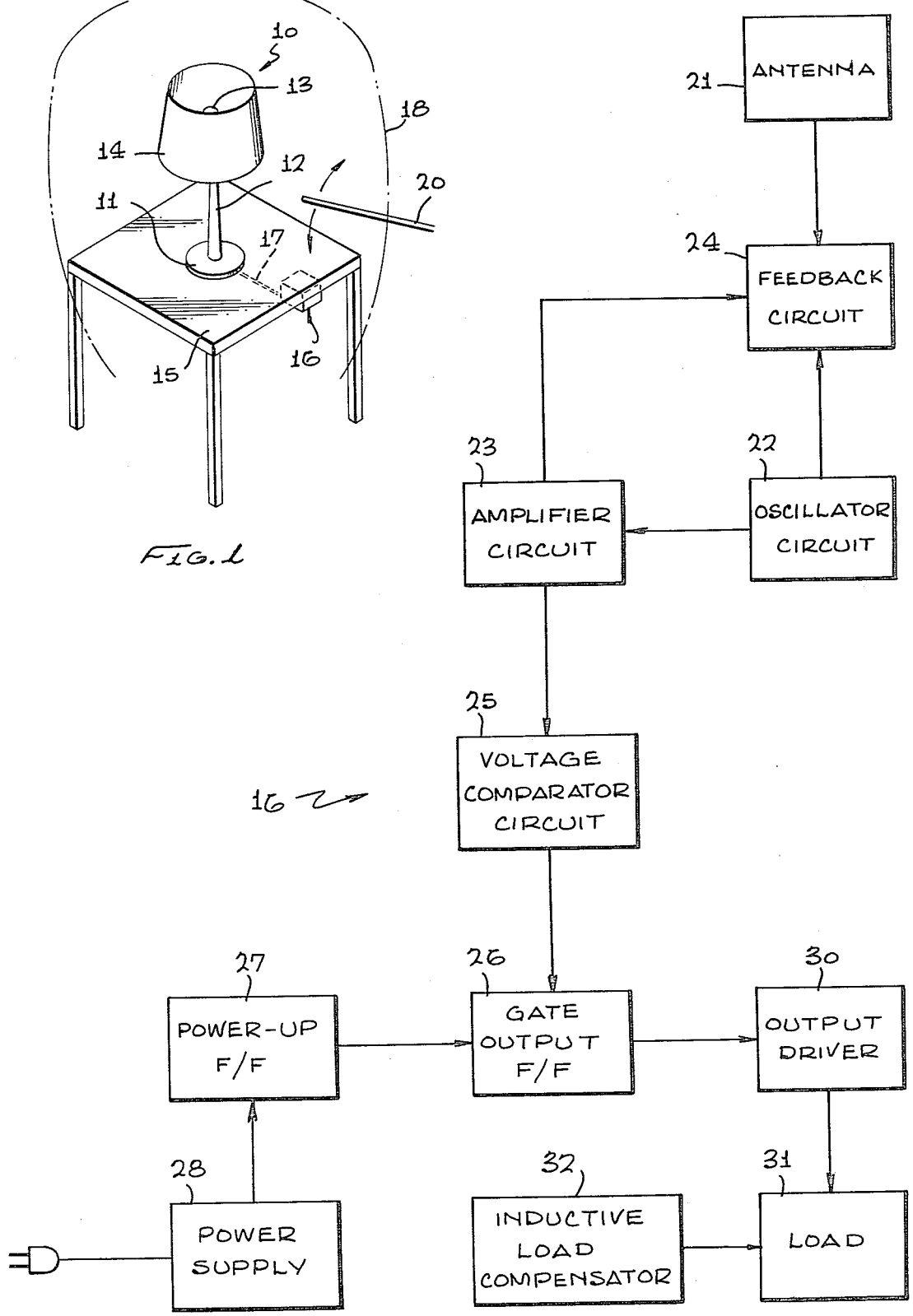
FIG. 1 is a prospective view of a lamp constituting a purely illustrative embodiment of the present invention and which incorporates the proximity switch of the present invention mounted on the underside of a supporting table.
FIG. 2 is a block diagram illustrating the general circuit of the present invention.

Referring to FIG. 1, an exemplary electric lamp is shown in the general direction of arrow 10 which includes a base 11 supporting an upright rod 12 terminating in a typical electrical socket carrying a light bulb 13. The light bulb is surrounded by a suitable shade 14 and the lamp 10 is supported on the upper surface of a table 15. The novel proximity detector or switch of the present invention is indicated by numeral 16 and is located out of visual sight by placement underneath the table top 15. Any suitable means for installation may be used. The lamp 10 is electrically connected to the proximity detector 16 via a conventional cord and plug indicated by numeral 17. In broken lines 18, an area is suggested in which the proximity detector will function when an intruder or object, such as wand 20, is waved.

Referring now to FIG. 2, a block diagram is illustrated showing the circuit arrangement comprising the electronic embodiment of the proximity detector 16. Within the detector, there is provided an antenna 21 for radiating an electromagnetic, radio frequency field which is indicated by numeral 18 in FIG. 1. An oscillator circuit 22 establishes the R F field around the antenna 21. The output of the oscillator circuit is coupled to an amplifing circuit 23 which monitors the condition of the oscillator and rectifies the output voltage therefrom and further, isolates the oscillator circuit from the remainder of the components. A feedback circuit 24 automatically adjusts the oscillator so that a constant voltage is present at the output of the amplifier 23 when there is no interference or disruption of the field 18. The output condition of the oscillator circuit when at constant voltage may be referred to as an idle condition.

A voltage comparative circuit 25 monitors the output D C Voltage of the amplifier 23. When the voltage reaches a predetermined threshold or level, a trigger signal is released and applied to a gate output circuit 26. The gate output circuit comprises a bistable flip flop which is set to an "off" condition by a power-up or setting circuit 27. The setting circuit 27 is operated when the power supply 28 is initially plugged into line voltage. In other words, when power is applied to the setting circuit 27, the flip flop power-up circuit prevents the gate output circuit 26 from going to a random "on"

condition. This always assures that the output from the gate output 26 will be in the "off" condition when the power is turned "on" until the trigger pulse is received from the voltage comparator circuit 25.

When the voltage from the amplifier circuit reaches a predetermined level at the voltage comparator circuit 25, a trigger signal is introduced to the gate output circuit 26. As mentioned earlier, this output stage will react to the trigger signal only when the power-up or setting circuit is satisfied that the applied voltage is stablized which is evidenced by the gate circuit being in the "on" condition. If the above conditions are met, the gate output circuit will flip to an "on" condition. Upon receiving the next trigger signal, the gate output circuit will go to the "off" condition. In other words, when the voltage comparator circuit is in the non-idle condition, a variable voltage is produced by the interference with the R F field so that the voltage comparative circuit senses a dip in voltage at the antenna which tunes the antenna coil to the oscillator coil so that the coil is loaded permitting current to flow. The voltage comparator circuit senses the change in voltage and initiates a trigger signal to the gate output circuit which is turned "on" since it is in the "off" condition in response to the setting circuit 27.

The output of the gate output circuit 26 is introduced to an output driver circuit 30 which isolates the 120 volt AC from the rest of the low voltage circuit. The input to the output driver circuit is amplified and through an optial-electric technique, such as use of a light emitting diode, a triac is turned "on". Operation of the triac applies power to a load indicated by numeral 31. An induced load compensator 32 is employed to stabilize the load when energized.

Referring now to FIG. 3, the circuit details of the present invention is illustrated and it can be seen that the block diagram of FIG. 2 is superimposed over the components and elements of the circuit and identified by corresponding reference numerals. It is noted that the oscillator circuit is a standard circuit employing transistors 40 and 41 which are operably connected to a tank circuit indicated in general by numeral 42. The tank circuit is connected to the antenna 21. Whenever an object, such as a persons hand, passes over the antenna 21, that is within approximately zero to six inches therefrom, the oscillator will become loaded to the point where oscillations cease. It is at this time that the voltage comparator 25 takes action and produces a trigger signal. The amplifier 23 is of conventional construction employing a transistor 43 and an integrated circuit 44. The comparator 25 includes an integrated circuit 45 which is directly coupled to one half of an integrated circuit 46 which is a standard dual flip-flop circuit. The integrated circuit 46 is identified as a Model 4013 and the other half of the flip-flop is identified by numeral 47 which is in the power-up or setting circuit 27. A pair of triacs 48 and 49 are included in the output driver 30 and are identified in the industry as M C 3011 and may be obtained from the Motorola. These triacs are of the optical variety. Through optical electronic techniques, the light from the light emitting diode 50 causes the triac to turn "on". There is no electrical circuit between the light emitting diode and the triac. The isolation voltage between the light emitting diode and the triac is seventy five hundred volts peak AC for five seconds.

The integrated circuit in the comparator 25 as indicated by numeral 45 is an industry standard identified by the numerals LM 311 while the operational amplifier 44 is identified as an industry standard by UA 741. The power supply 28 employs a standard bridge circuit 51 while a plug 52 connects with suitable line voltage. An output plug 53 may be readily attached to any suitable appliance or load such as the lamp shown in FIG. 1. An inductive load compensator 32 is provided by the series connection of capacitor 54 and resistor 55.

Therefore, in view of the foregoing it can be seen that the novel circuit of the present invention provides a novel proximity switch which may be readily activated by the presence of an object or agent in the vicinity of the antenna 21. The circuit is maintained in tune so as to compensate for the growth of nearby plants or the like. The circuit operates only in the presence of rapidly moving objects or persons. The power supply 28 is plugged into a normal 120 volts, AC house current and changes the line voltage to a low voltage DC, which is used to service all the internal circuits. The oscillator circuit 22 sets up a radio frequency field around the antenna 21 while the amplifier circuit monitors the condition of the oscillator, rectifies its output and isolates the oscillator from the rest of the circuit. The feedback circuit automatically adjusts the oscillator so that a constant voltage is seen at the output of the amplifier.

When the power is applied by plugging in to the line voltage, the flip-flop in the power-up or setting circuit 27 maintains the gate output flip-flop from going to a random "on" condition. It always assures that the output will be in the "off" position when power is applied. The voltage comparator 25 monitors the output DC voltage of the amplifier. When the voltage reaches a predetermined level, a trigger signal is initiated to the gate output flip-flop 26. If the above conditions are met, the output circuit will go to an "on" condition. Upon receiving the next trigger signal, the output circuit 30 will go to the "off".

In other words, when the voltage from the amplifier circuit is constant, this represents an idle condition. When the output from the amplifier circuit is a variable voltage, then interference with the RF about the antenna 21 is present. The voltage comparator circuit senses a dip in the voltage at the antenna which tunes out the oscillator coil so that the coil is loaded and current will flow. Zero voltage is represented by the idle condition. The voltage comparator senses the voltage and fires a flip-flop to actuate the gate output circuit.

The output driver 30 isolates the 120 volt AC voltage from the rest of the low voltage circuit. The input to the output driver is amplified and the signal drives the light emitting diode. Through opto-electronic techniques, the light from the light emitting diode causes the triac to turn "on". There is no electrical circuit between the light emitting diode and the triac.

A high resistance to high voltage is shown which is able to get back into the circuit itself so that no dangerous potential or voltage will be available or present at the antenna. However, further isolation is provided by enclosing the antenna and making it inaccessible for touching or handling.

Whenever an object, such as the hand or the body of a person passes in close proximity to the antenna 21, the oscillator will become loaded to the point where oscillations cease. It is at this time that the voltage comparator takes action and produces a trigger signal. The feedback circuit is employed to slowly adjust for changes in the close environment such as humidity, nearby growing plants or any change near the antenna.

While particular embodiments of the present invention have been shown and described, it will be obvious to those skilled in the art that changes and modifications may be made without departing from this invention in its broader aspects and, therefore, the aim in the appended claims is to cover all such changes and modifications as fall within the true spirit and scope of this invention.

What is claimed is:

1. A proximity switch for sensing the presence of an object or agent comprising the combination of:

an antenna;

an oscillator coupled to said antenna and adapted to modify oscillations in response to the presence of an object or agent in close proximity to said antenna;

a voltage comparator operably coupled to said oscillator for initiating a trigger signal in response to modification of oscillations from said oscillator;

a voltage setting circuit producing a threshold voltage level;

a bistable circuit operatively coupled to said voltage setting circuit and responsive to said trigger signal in the presence of said threshold voltage level to provide an output voltage level;

a load operably connected to said bistable circuit for receiving said output voltage level and being actuated thereby;

a feedback circuit connected between said antenna and said oscillator;

an amplifier circuit interconnecting said oscillator circuit with said feedback circuit for rectifying its output;

an output driver network including a light emitting diode circuit operably coupled between said load and said bistable circuit;

said voltage setting circuit is a first flip-flop circuit and said bistable circuit is a gate circuit having a second flip-flop circuit;

an inductive load compensator network coupled to said load;

said voltage comparator is coupled to said oscillator circuit via said amplifier circuit for sensing a dip in voltage therefrom resulting from the inference with an electromagnetic field surrounding said antenna; and said electromagnetic field is established by said oscillator.

* * * * *